(12) United States Patent
Golara et al.

(10) Patent No.: US 12,504,333 B2
(45) Date of Patent: Dec. 23, 2025

(54) CMOS-BASED TEMPERATURE SENSOR

(71) Applicant: Apple Inc., Cupertino, CA (US)

(72) Inventors: Soheil Golara, San Jose, CA (US); Mansour Keramat, Los Gatas, CA (US); Seyedeh Sedigheh Hashemi, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 519 days.

(21) Appl. No.: 17/882,043

(22) Filed: Aug. 5, 2022

(65) Prior Publication Data
US 2024/0044717 A1   Feb. 8, 2024

(51) Int. Cl.
*G01K 7/01* (2006.01)
*H03K 17/687* (2006.01)

(52) U.S. Cl.
CPC ........... *G01K 7/01* (2013.01); *H03K 17/6872* (2013.01)

(58) Field of Classification Search
CPC .. G01K 7/01; G01K 2219/00; H03K 17/6872; H03K 19/00369; H03K 19/00384; H03K 17/14; H03K 17/145; G01R 19/32; G05F 1/463; G05F 3/30
See application file for complete search history.

(56) References Cited

U.S. PATENT DOCUMENTS

| 11,181,426 | B1 | 11/2021 | Cullen et al. | |
| 2010/0052643 | A1 | 3/2010 | Cho et al. | |
| 2013/0259091 | A1* | 10/2013 | Chen | G01K 7/34 374/E1.001 |
| 2020/0278708 | A1 | 9/2020 | Tesch | |

OTHER PUBLICATIONS

Law, M., Bermak, A., & Luong, H.C. (2010). A Sub-µ W Embedded CMOS Temperature Sensor for RFID Food Monitoring Application. IEEE Journal of Solid-State Circuits, 45, 1246-1255.

* cited by examiner

*Primary Examiner* — Jung Kim
(74) *Attorney, Agent, or Firm* — Sterne, Kessler, Goldstein & Fox P.L.L.C.

(57) ABSTRACT

A compact low voltage CMOS-based temperature sensor can include a reference voltage generator, a temperature front-end circuit, and an analog-to-digital converter (ADC). The reference voltage generator can be configured to generate a reference voltage independent of temperature. The temperature front-end circuit can include first and second transistors configured to generate a temperature signal proportional to temperature. The first MOS transistor can include first and second terminals. The first terminal can be electrically coupled to the reference voltage. The second terminal can be electrically coupled to the second MOS transistor. The second terminal can provide the temperature signal. The ADC can be electrically coupled to the reference voltage and configured to convert the temperature signal to a digital signal.

20 Claims, 10 Drawing Sheets

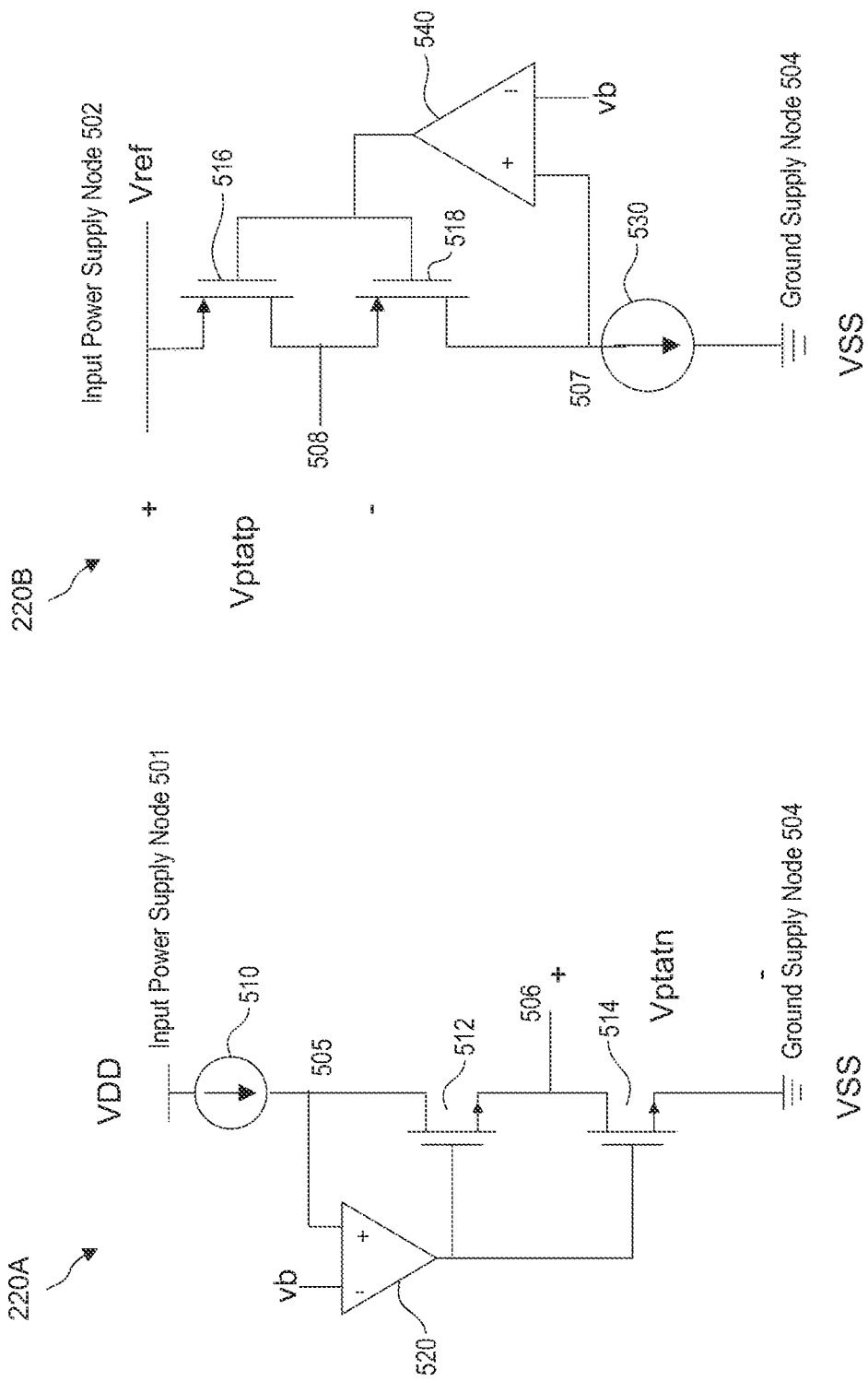

CMOS-BASED TEMPERATURE SENSOR

FIELD

This disclosure relates to analog circuits in computer systems and, more particularly, to a complementary metal-oxide-semiconductor (CMOS)-based temperature sensor.

BACKGROUND

Modern computer systems include multiple circuit blocks designed to perform various functions. For example, such circuit blocks can include processors or processor cores configured to execute software or program instructions. Additionally, the circuit blocks can include memory, mixed-signal or analog circuits, and the like.

In some computer systems, certain areas of the circuit blocks may overheat and lead to functional failures of the circuit blocks during operation. A temperature sensor can be integrated into such computer systems for temperature monitoring and system protection. The temperature sensor can provide temperature information to prevent the computer system from overheating.

SUMMARY

Various embodiments of a CMOS-based temperature sensor are disclosed. In some embodiments, a circuit includes a reference voltage generator, a temperature circuit and an analog-to-digital converter (ADC). The reference voltage generator is configured to generate a reference voltage. The temperature circuit includes a first transistor and a second transistor. The temperature circuit is configured to generate a temperature signal proportional to temperature. The first transistor includes first and second terminals. The first terminal is electrically coupled to the reference voltage. The second terminal is electrically coupled to the second transistor. The second terminal provides the temperature signal. The ADC is electrically coupled to the reference voltage and configured to generate a digital signal based on the temperature signal.

In some embodiments, a complementary metal-oxide-semiconductor (CMOS)-based temperature sensor includes a reference voltage generator configured to generate a reference voltage with a first set of MOS transistors, a temperature circuit configured to generate a temperature signal with a second set of MOS transistors, and an analog-to-digital converter (ADC) electrically coupled to the reference voltage and configured to generate a digital signal based on the temperature signal.

In some embodiments, a method includes generating a reference voltage with a first set of MOS transistors and a bias current independent of an input power supply, generating a temperature signal with a second set of MOS transistors and the reference voltage, and generating a digital signal based on the temperature signal and the reference voltage.

BRIEF DESCRIPTION OF THE DRAWINGS

Aspects of the present disclosure are best understood from the following detailed description when read with the accompanying figures.

FIGS. 5A-5C illustrate various embodiments of a temperature front-end circuit.

Illustrative embodiments will now be described with reference to the accompanying drawings. In the drawings, like reference numerals generally indicate identical, functionally similar, and/or structurally similar elements.

DETAILED DESCRIPTION

Figure 1:
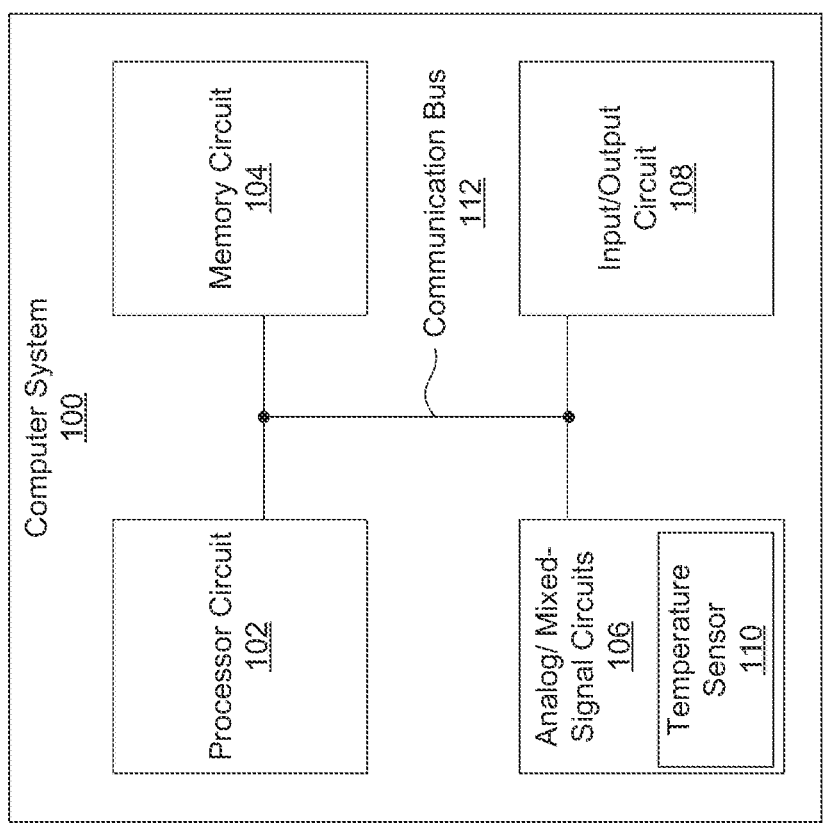
FIG. 1 illustrates a computer system that includes a CMOS-based temperature sensor, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

It is to be understood that the phraseology or terminology herein is for the purpose of description and not of limitation, such that the terminology or phraseology of the present specification is to be interpreted by those skilled in relevant art(s) in light of the teachings herein.

Temperature sensors can be integrated in a computer system, such as a central processing unit (CPU), a graphics processing unit (GPU), and a system on a chip (SoC), to monitor temperature. Based on temperature information, the computer system can reduce or interrupt an operation to avoid overheating or functional failures. The computer system can also use the temperature information to adjust performance of certain electronic components. An accurate temperature reading is thus important for computer systems.

However, circuit issues (e.g., offset and gain) and production issues (e.g., mechanical stress) can affect the accuracy and precision of temperature readings. For example, a temperature sensor can include a temperature front-end circuit to receive an on-chip temperature signal, an analog-to-digital converter (ADC) to convert the temperature signal to a digital signal, and a calibration circuit to calibrate the temperature sensor at a single temperature or multiple temperatures. The temperature sensor can include a bipolar-based temperature sensor. However, these types of temperature sensors can require a larger power supply rail (e.g., about 1 V to about 1.5 V) with small power supply variations (e.g., about 1% to about 5%). In contrast, digital circuits of the computer system can have a smaller digital power supply rail (e.g., about 0.5 V to about 0.9 V) with larger variations (e.g., about 8% to about 20%). Thus, bipolar-based temperature sensors can be challenging to integrate into digital circuits of computer systems.

Additionally, bipolar-based temperature sensors can require more area than other types of devices since, for example, bipolar junction transistor (BJT) devices can occupy more area (e.g., about 10 times more area) than MOS transistors. Further, bipolar-based temperature sensors use a bandgap reference circuit to provide a reference voltage and a proportional to absolute temperature (PTAT) current. The PTAT current has a low temperature sensitivity that is proportional to a log of BJT devices' size ratio. An increase in temperature sensitivity requires an exponential increase in the BJT devices' size. With the continuous scaling down of semiconductor devices, bipolar-based temperature sensors become increasingly challenging to integrate into computer systems.

Various embodiments in the present disclosure provide a compact low voltage CMOS-based temperature sensor. The CMOS-based temperature sensor includes a CMOS-based reference voltage generator, a CMOS-based temperature front-end circuit, and a high precision ADC. The CMOS-based reference voltage generator can use a low voltage digital power supply (e.g., about 0.5 V to about 0.9 V) to generate a reference voltage independent of temperature and the digital power supply. In some embodiments, the reference voltage can be generated based on a difference between threshold voltages of two MOS transistors. The CMOS-based temperature front-end circuit can include first and second MOS transistors. The first MOS transistor can include a first terminal electrically coupled to the reference voltage and a second terminal electrically coupled to the second MOS transistor. The second terminal can provide a temperature signal proportional to temperature. In some embodiments, the transistors disclosed herein can be fabricated on the same process node.

In some embodiments, the CMOS-based temperature front-end circuit can generate a pair of differential temperature signals with n-type and p-type MOS transistors to increase temperature sensitivity. The ADC can be electrically coupled to the reference voltage and convert the temperature signal to a digital signal. Implemented with n-type and p-type MOS transistors, the temperature sensor can integrate the reference voltage generator and temperature front-end circuit into a single design having a smaller area and higher temperature sensitivity than bipolar-based temperature sensors. Additionally, in some embodiments, the compact low voltage CMOS-based temperature sensor can save power by about 1% to about 10% compared to other temperature sensor designs.

FIG. 1 illustrates a computer system 100 that includes a CMOS-based temperature sensor 110, according to some embodiments. As shown in FIG. 1, computer system 100 can include also a processor circuit 102, a memory circuit 104, analog/mixed-signal circuits 106, and an input/output circuit 108, each of which is coupled to a communication bus 112. In some embodiments, computer system 100 can be a SoC. In some embodiments, computer system 100 can be configured for use in a desktop computer, a server, or a mobile computing application, such as a tablet, a laptop computer, and a wearable computing device.

In some embodiments, processor circuit 102 can be representative of a general-purpose processor that performs computational operations. For example, processor circuit 102 can be a CPU such as a microprocessor, a GPU, a microcontroller, an application-specific integrated circuit (ASIC), or a field-programmable gate array (FPGA). It is noted that although a single processor circuit 102 is illustrated in FIG. 1, any suitable number of processors may be employed. During the computational operations of processor circuit 102, processor circuit 102 can generate heat, and the temperature of processor circuit 102 can increase when excessive heat builds up. If the temperature is above a certain threshold (e.g., above about 60° C.), processor circuit 102 may overheat and functional failures may occur.

In some embodiments, memory circuit 104 can include any suitable type of memory, such as a dynamic random-access memory (DRAM), a static random-access memory (SRAM), a read-only memory (ROM), an electrically erasable programmable read-only memory (EEPROM), or a non-volatile memory. It is noted that although a single memory circuit 104 is illustrated in FIG. 1, any suitable number of memory circuits may be employed.

In some embodiments, analog/mixed-signal circuits 106 can include a CMOS-based temperature sensor 110. CMOS-based temperature sensor 110 can be configured to provide temperature information of computer system 100. For example, CMOS-based temperature sensor 110 can measure the temperature of processor circuit 102 and generate a digital temperature signal. Based on the digital temperature signal, processor circuit 102 can reduce or interrupt operations performed by processor circuit 102 to avoid overheating and functional errors. Additionally, processor circuit 102 can adjust the performance of certain electronics, such as memory circuit 104 and input/output circuit 108, based on the temperature information of computer system 100. In some embodiments, CMOS-based temperature sensor 110 can include a CMOS-based reference voltage generator and a CMOS-based temperature front-end circuit, which are described in detail below. Implemented with MOS transistors, CMOS-based temperature sensor 110 can achieve a compact design by integrating the reference voltage generator and temperature front-end circuit. In some embodiments, compared to bipolar-based temperature sensors, the CMOS-based temperature sensor 110 can occupy a smaller area on a chip and can provide a higher temperature sensitivity than bipolar-based temperature sensors. In some embodiments, the CMOS-based reference voltage generator can use a low voltage digital power supply to generate a reference voltage independent of temperature and the digital power supply. The temperature and power supply independent reference voltage can improve temperature sensor accuracy and reduce temperature signal error.

In some embodiments, analog/mixed-signal circuits 106 can include additional circuits (not shown), such as a crystal oscillator circuit, a phase-locked loop (PLL) circuit, and a digital-to-analog converter (DAC) circuit. In some embodiments, analog/mixed-signal circuits 106 can be configured to perform power management tasks with the inclusion of on-chip power supplies and voltage regulators.

In some embodiments, input/output circuit 108 can be configured to coordinate data transfer in computer system 100 and between computer system 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuit 108 may be configured to implement a version of universal serial bus (USB) protocol or IEEE 1394 (Firewire®) protocol.

Input/output circuit 108 may also be configured to coordinate data transfer between computer system 100 and one or more devices (e.g., other computing systems or integrated circuits) coupled to computer system 100 via a network. In one embodiment, input/output circuit 108 may be configured to perform the data processing necessary to implement an Ethernet (IEEE 802.3) networking standard such as Gigabit Ethernet or 10-Gigabit Ethernet, although it is contemplated that any suitable networking standard may be implemented. In some embodiments, input/output circuit 108 may be configured to implement multiple discrete network interface ports.

Figure 2:
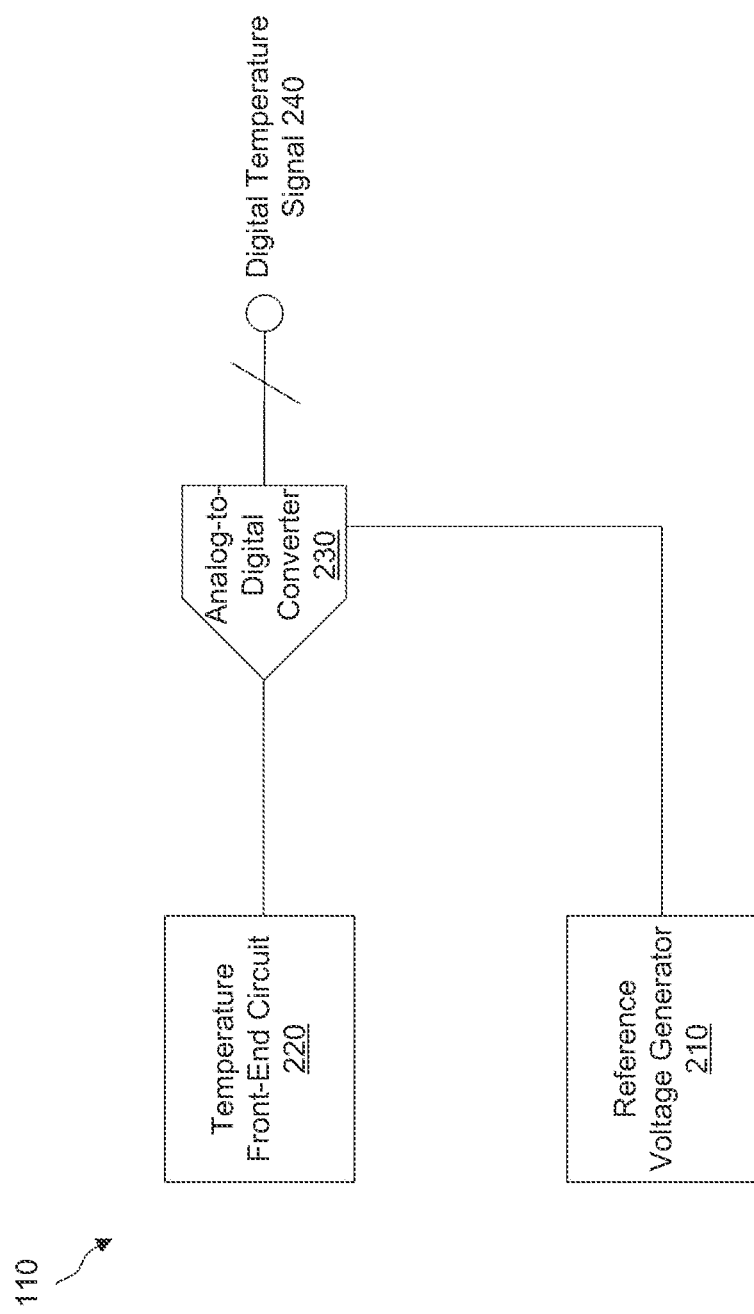
FIG. 2 illustrates a CMOS-based temperature sensor, according to some embodiments.

FIG. 2 illustrates a CMOS-based temperature sensor 110, according to some embodiments. CMOS-based temperature sensor 110 can include a CMOS-based reference voltage generator 210, a CMOS-based temperature front-end circuit 220, and an ADC 230. In some embodiments, CMOS-based reference voltage generator 210 can use a low voltage digital power supply to generate a reference voltage independent of temperature and the digital power supply. In some embodiments, CMOS-based temperature front-end circuit 220 can generate a temperature signal proportional to temperature based on two or more MOS transistors. In some embodiments, ADC 230 can be electrically coupled to the reference voltage and convert the temperature signal to a digital temperature signal 240. In some embodiments, CMOS-based reference voltage generator 210 can generate the reference voltage based on a difference between threshold voltages of two MOS transistors, for example, as shown in FIG. 3.

Figure 3:
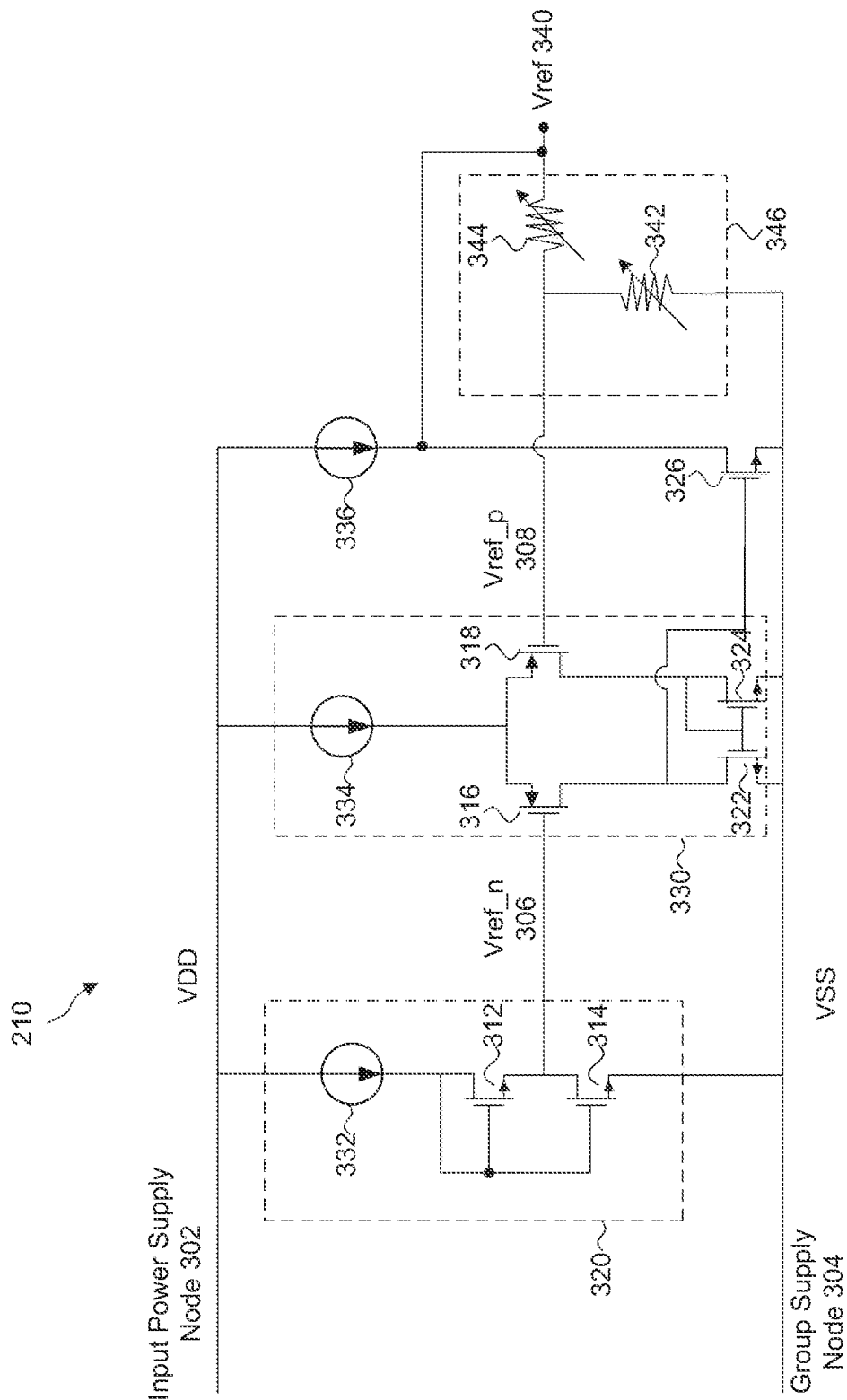
FIG. 3 illustrates a reference voltage generator, according to some embodiments.

FIG. 3 illustrates a CMOS-based reference voltage generator 210, according to some embodiments. CMOS-based reference voltage generator 210 can be electrically coupled to input power supply node 302 and ground supply node 304. In some embodiments, input power supply node 302 can be electrically connected to a low voltage digital power supply (e.g., about 0.5 V to about 0.9 V), also referred to as "VDD." Ground supply node 304 can be electrically connected to a ground level (e.g., 0 V), also referred to as "VSS." CMOS-based reference voltage generator 210 can include current sources 332, 334, and 336, devices 312, 314, 316, 318, 322, 324, and 326, and resistors 342 and 344. In some embodiments, current source 332 and devices 312 and 314 can form a first reference voltage circuit 320 to generate a reference voltage Vref_n 306. In some embodiments, current source 334 and devices 316, 318, 322, and 324 can form a second reference voltage circuit 330 to generate a reference voltage Vref_p 308. In some embodiments, resistors 342 and 344 can form a trim circuit 346 to generate a scaled reference voltage Vref 340.

Referring to FIG. 3, current sources 332, 334, and 336 can be electrically coupled to input power supply node 302 and can be configured to generate a substantially constant bias current for devices 312, 314, 316, 318, and 326. In some embodiments, current sources 332, 334, and 336 can be implemented as part of a current mirror circuit, or any other suitable circuit configured to generate a substantially constant bias current. In some embodiments, the substantially constant bias current can be independent of the input power supply provided by input power supply node 302.

Referring to FIG. 3, devices 312, 314, 316, 318, 322, 324, and 326 can be implemented as MOS transistors. In some embodiments, MOS transistors can also be referred to as "field-effect transistors" (FETs). As used and described herein, a MOS transistor or a FET is a type of transistor that uses an electric field to control the flow of current in an integrated circuit. Various types of technologies can be used to fabricate a MOS transistor. In some embodiments, MOS transistors can include metal-oxide semiconductor field-effect transistors ("MOSFETs"), fin field-effect transistors ("FinFETs"), gate-all-around field-effect transistors ("GAAFETs"), and the like.

In some embodiments, a MOS transistor can have three terminals denoted as "source," "gate," and "drain." In response to an application of a voltage to the gate terminal, the MOS transistor alters the conductivity between the drain and source terminals, thereby changing the flow of current between the two terminals. The voltage applied to the gate terminal needs to exceed a particular value (referred to as a "threshold voltage") to allow the current flowing between the drain and source terminals. The current between the drain and source terminals generally increases in response to an increase in the voltage level applied to the gate. Depending on a type of majority carrier (e.g., n-type or p-type) that conducts current between the source and drain terminals, the polarity of voltage level applied to the gate terminal may be different relative to the threshold voltage.

In some embodiments, devices 312, 314, 322, 324, and 326 can be implemented as n-type MOS transistors, such as n-type MOSFETs, FinFETs, GAAFETs, and any other suitable devices. In some embodiments, devices 316 and 318 can be implemented as p-type MOS transistors, such as p-type MOSFETs, FinFETs, GAAFETs, and any other suitable devices. In some embodiments, the respective threshold voltages of devices 312 and 314 can be different. In some embodiments, the respective threshold voltages of devices 316 and 318 can be different. For example, devices 312 and 318 can be implemented as low-threshold devices, while devices 314 and 316 can be implemented as standard-threshold devices.

As shown in FIG. 3, first reference voltage circuit 320 can generate reference voltage Vref_n 306. Reference voltage Vref_n 306 can be the difference between the gate-to-source voltages of device 314 and device 312 as depicted in equation (1), where Vgs(314) is the gate-to-source voltage of device 314 and Vgs(312) is the gate-to-source voltage of device 312.

$$Vref\_n\ 306 = Vgs(314) - Vgs(312) \quad (1)$$

Since both device 312 and device 314 are coupled together in series, and there is negligible current into device 316, the respective drain-to-source currents Ids of devices 312 and device 314 are the same as depicted in equation (2), where $\mu_n$ is electron mobility, $C_{ox}$ is the oxide capacitance, W is the channel width, L is the channel length, Vgs is the gate-to-source voltage, Vth is the threshold voltage, $\lambda$ is the channel-length modulation parameter, and Vds is the drain-to-source voltage.

$$Ids = \tfrac{1}{2}\mu_n C_{ox}(W/L)(Vgs-Vth)^2(1+\lambda Vds) \quad (2)$$

Solving the gate-to-source voltages (Vgs) for both device 312 and 314, and substituting into equation (1), reference voltage Vref_n 306 can be calculated as a difference between the threshold voltages of devices 312 and 314, as depicted in equation (3), where Vth(312) is the threshold voltage for device 312 and Vth(314) is the threshold voltage for device 314. In some embodiments, equation (3) assumes that channel-length modulation effects are negligible. In some embodiments, devices 312 and 314 can be designed to use long-channel devices to minimize channel-length modulation effects. In some embodiments, equation (3) also assumes that the beta ratios for devices 312 and 314 are the same. As used and defined herein, the beta ratio for a MOS transistor is a ratio of the MOS transistor's width to its length.

$$Vref\_n\ 306 = Vth(314) - Vth(312) \tag{3}$$

In some embodiments, multiple reference voltage circuits can be coupled together in a serial fashion (referred to as a "cascade") to generate larger reference voltage values. Referring to FIG. 3, second reference voltage circuit 330 can be coupled to first reference voltage circuit 320 to generate reference voltage Vref_p 308. Though FIG. 3 illustrates two reference voltage circuits coupled together, one or more reference voltage circuits can be cascaded together to generate various reference voltage values.

As shown in FIG. 3, gate terminals of devices 322 and 324 in second reference voltage circuit 330 can be connected to form a current mirror circuit. The current mirror circuit can generate a same current flowing through devices 316 and 318. Similar to first reference voltage circuit 330, reference voltage Vref_p 308 can be the difference between the gate-to-source voltages of device 316 and device 318. As the gate terminal of device 316 is set at reference voltage Vref_n 306, reference voltage Vref_p 308 can be calculated as a sum of the threshold voltage difference between devices 312 and 314 and the threshold voltage difference between devices 316 and 318. Reference voltage Vref_p 308 can be described by equation (4), where Vth(316) is the threshold voltage for device 316 and Vth(318) is the threshold voltage for device 318.

$$Vref\_p\ 308 = Vth(314) - Vth(312) + Vth(316) - Vth(318) \tag{4}$$

During the manufacturing of integrated circuits, differences in lithography, dopant implant levels, and the like, can result in small changes in the electrical properties of MOS transistors from one integrated circuit to another. Such changes can result in a reference voltage circuit, such as reference voltage circuits 320 and 330, generating different values for a reference voltage from one integrated circuit to another. While the changes may be small (e.g., less than a millivolt), they may affect the performance of circuits that use the reference voltage. To address such variations, a voltage reference circuit can be adjusted or "trimmed" based on measured characteristics after the manufacturing process has been completed. In some embodiments, current source 336, device 326, and trim circuit 346 can be arranged as shown in FIG. 3 to generate a scaled reference voltage Vref 340, as depicted in equation (5), where R(342) is the resistance of resistor 342 and R(344) is the resistance of resistor 344. In some embodiments, the resistances of resistors 342 and 344 can be adjusted to tune reference voltage Vref 340 to a target value. In some embodiments, trim circuit 346 can be optional.

$$Vref\ 340 = (1 + R(344)/R(342))Vref\_p\ 308 \tag{5}$$

As described above, reference voltage Vref 340 is generated based on the threshold voltages of devices 312, 314, 316, and 318 and resistances of resistors 342 and 344, which may not change with the temperature. When temperature increases or decreases, the respective values of reference voltage Vref 340 can remain the same. As a result, reference voltage Vref 340 can be independent of temperature.

Figure 4A:
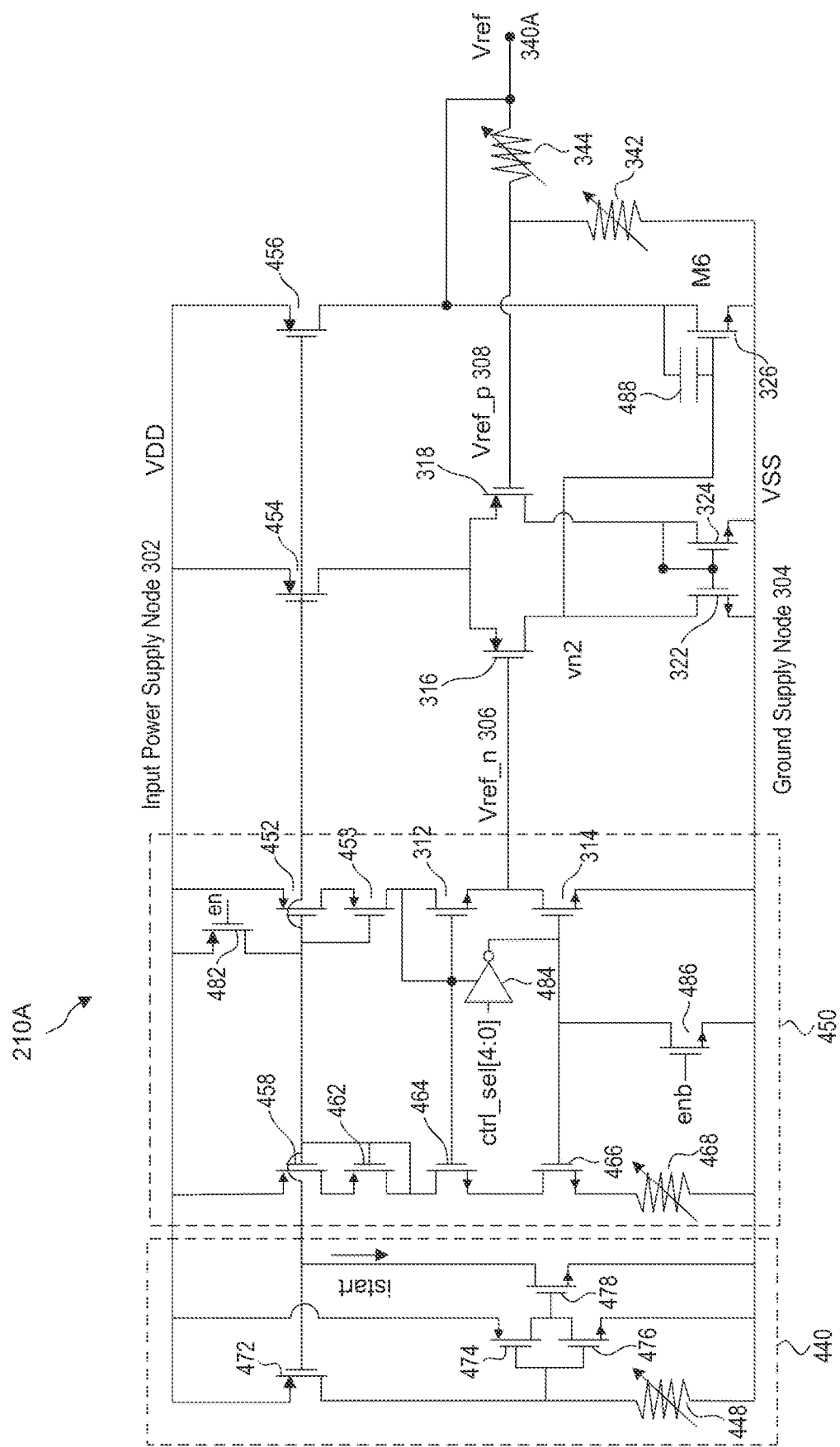
FIGS. 4A and 4B illustrate various embodiments of a reference voltage generator.
Figure 4B:
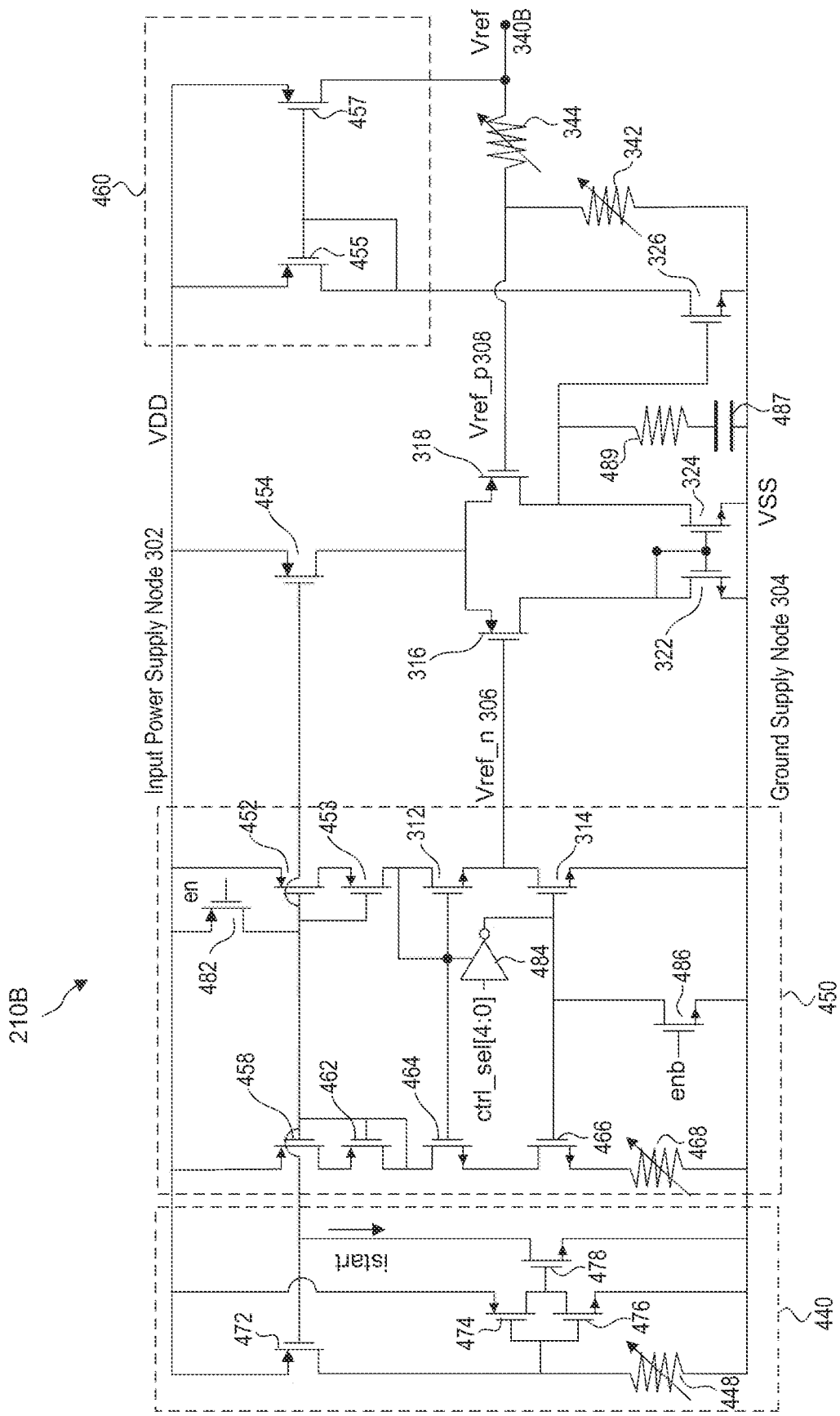

FIGS. 4A and 4B illustrate reference voltage generators 210A and 210B, according to some embodiments. Elements in FIGS. 4A and 4B with the same annotations as elements in FIG. 3 are described above. In some embodiments, reference voltage generators 210A and 210B can include a supply independent biasing circuit 450 to generate a substantially constant bias current independent of the power supply. In some embodiments, supply independent biasing circuit 450 can improve power supply rejection ratio (PSRR) by an order of magnitude. As used and defined herein, the PSRR is defined as the ratio of the change in supply voltage to the equivalent output voltage it produces.

In some embodiments, supply independent biasing circuit 450 can include resistor 468 and devices 312, 314, 452, 453, 458, 462, 464, and 466. In some embodiments, devices 464 and 466 can be implemented as n-type MOS transistors, such as n-type MOSFETs, FinFETs, GAAFETs, and any other suitable devices. In some embodiments, the threshold voltages of devices 464 and 466 can be different. For example, device 464 can be implemented as a low-threshold device (e.g., Vth from about 0.2 V to about 0.5 V), while device 466 can be implemented as a standard-threshold device (e.g., Vth from about 0.6 V to about 1.0 V). In some embodiments, devices 452, 453, 458, and 462 can be implemented as p-type MOS transistors, such as p-type MOSFETs, FinFETs, GAAFETs, and any other suitable devices. As shown in FIG. 4A, gate terminals of devices 452, 453, 458, and 462 can be connected to form a current mirror circuit, and gate terminals of devices 312, 314, 464, and 466 can be connected to form another current mirror circuit. As a result, the current flowing through device 466 and device 314 can be the same and independent of the power supply from input power supply node 302. In some embodiments, the substantially constant bias current generated by supply independent biasing circuit 450 can be adjusted by resistor 468. In some embodiments, supply independent biasing circuit 450 can also be referred to as a "contact gm biasing circuit." The substantially constant gm can refer to the transconductance of a MOS transistor, which can be independent of temperature, process variations, and power supply.

Referring to FIG. 4A, reference voltage generator 210A can further include a control selector 484, a capacitor 488, a resistor 448, and devices 454, 456, 472, 474, 476, 478, 482, 486, and 488. In some embodiments, devices 476, 478, and 486 can be implemented as n-type MOS transistors, such as n-type MOSFETs, FinFETs, GAAFETs, and any other suitable devices. In some embodiments, devices 454, 456, 472, 474, 482, and 486 can be implemented as p-type MOS transistors, such as p-type MOSFETs, FinFETs, GAAFETs, and any other suitable devices. In some embodiments, control selector 484 can select device 314 out of a number of MOS transistors to adjust a temperature response of device 314, in case device 314 has a systematic temperature drift due to process variations. In some embodiments, control selector 484 can select device 314 with a specific W/L size ratio to adjust the temperature response of device 314. For example, device 314 can have a flat voltage versus temperature response, a positive slope voltage versus temperature response, or a negative slope voltage versus temperature response. In some embodiments, the adjustable temperature response can benefit various applications.

Though FIGS. 4A and 4B illustrate control selector 484 inputs control signals ctrl sel [4:0], control selector 484 can input any number of control signals and can select device 314 out of any number of MOS transistors. In some embodiments, capacitor 488 can be a Miller compensation capacitor connected in the negative feedback loop of reference voltage generator 210A to stabilize reference voltage Vref 340A.

In some embodiments, devices 472, 474, 476, and 478 and resistor 448 can form a start-up circuit 440 to drive supply independent biasing circuit 450 out of degenerate bias point (e.g., zero current) when the power supply is turned on. In some embodiments, as shown in FIG. 4A, devices 472, 458, 462, 452, 453, 454, and 456 can be configured to form current mirror circuits. In some embodiments, the sizes of devices 472, 458, 462, 452, 453, 454, and 456 can be matched to generate the substantially same constant bias current flowing through each device. In some embodiments, device 482 can be controlled by an enable signal (referred to as "en") during start-up of the circuit. Device 482 can be configured to, in response to an activation of the enable signal, couple input power supply node 302 to device 478, allowing a start-up current (referred to as "istart") to flow through device 478. In some embodiments, device 486 can be controlled by a complementary enable signal (referred to as "enb"). Device 486 can be configured to, in response to an activation of the complementary enable signal, couple devices 452 and 453 to ground supply node 304, allowing a current to flow through devices 452 and 453. In some embodiments, device 456 can maintain the substantially constant bias current at the output stage of reference voltage generator 210A through device 326 and resisters 342 and 344.

In some embodiments, as shown FIG. 4B, reference voltage generator 210B can further include a regulated current circuit 460 to provide a regulated current at the output stage. In some embodiments, regulated current circuit 460 can include devices 455 and 457. In some embodiments, devices 455 and 457 can be implemented as p-type MOS transistors, such as p-type MOSFETs, FinFETs, GAAFETs, and any other suitable devices. In some embodiments, the sizes of devices 455 and 457 can be matched to provide the regulated current. However, the sizes of devices 455 and 457 may not need to be matched with the sizes of devices 458, 452, and 454.

In some embodiments, reference voltage generator 210B can include a capacitor 487 and resistor 489 to shunt the high-frequency signals generated in the circuit to ground and to compensate the negative feedback loop in reference voltage generator 210B. The negative feedback loop can include devices 326, 455, and 457. Comparing reference voltage generator 210A to reference voltage generator 210B, reference voltage generator 210A can have a more compact compensation scheme because of the smaller capacitance of Miller compensation capacitor 488. However, reference voltage generator 210B can provide a larger direct-current (DC) loop gain due to an extra gain stage provided by devices 455 and 457 in regulated current circuit 460.

Figure 5C:
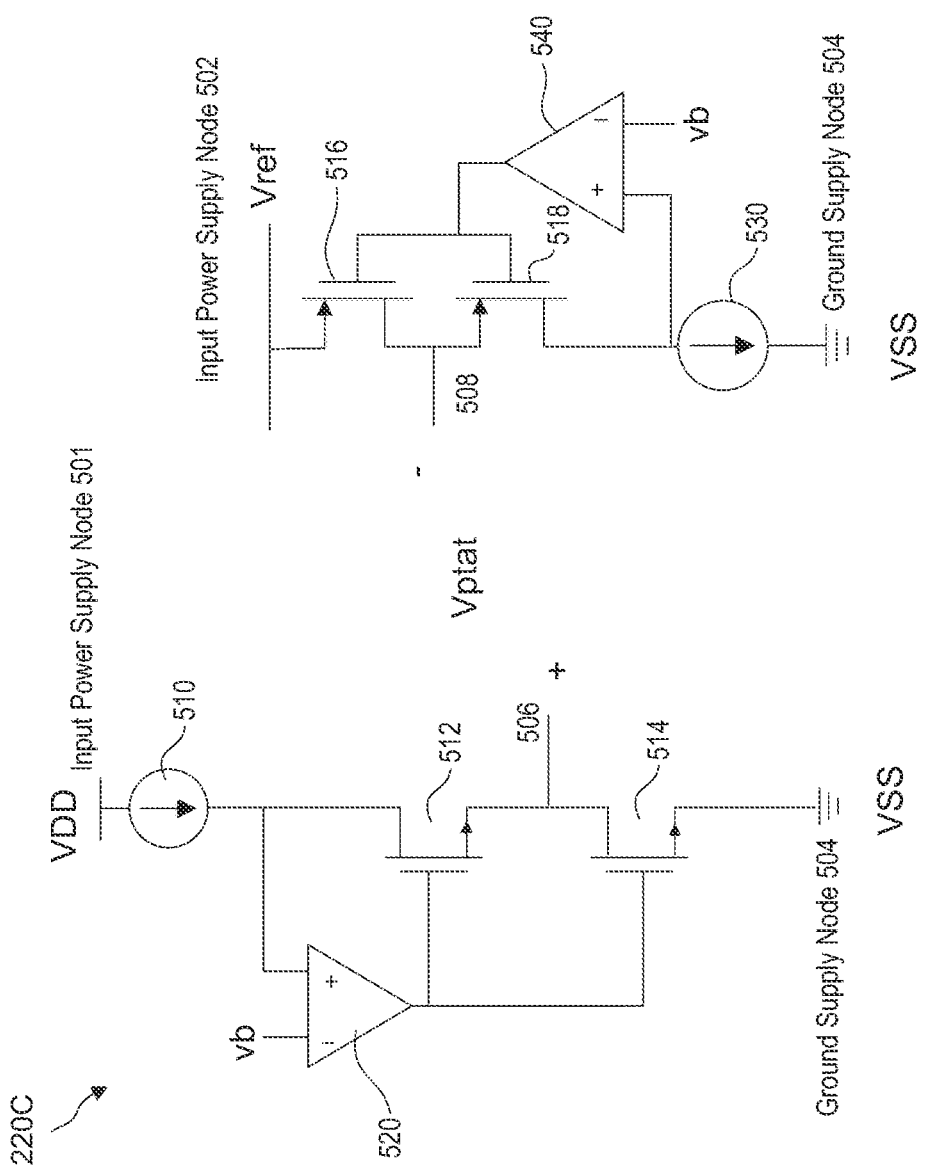

FIG. 5A-5C illustrate temperature front-end circuits 220A, 220B, and 220C, according to some embodiments. As shown in FIG. 5A, temperature front-end circuit 220A can include a current source 510, an amplifier 520, and devices 512 and 514. In some embodiments, current source 510 can be electrically coupled to input power supply node 501 and can be configured to generate a substantially constant bias current through devices 512 and 514. In some embodiments, current source 510 can be implemented as part of a current mirror circuit, or any other suitable circuit configured to generate a substantially constant bias current. In some embodiments, input power supply node 501 can be electrically connected to a low voltage digital power supply (e.g., VDD at about 0.5 V to about 0.9 V). In some embodiments, devices 512 and 514 can be implemented as n-type MOS transistors, such as n-type MOSFETs, FinFETs, GAAFETs, and any other suitable devices.

In some embodiments, amplifier 520 can generate a gate control signal for devices 512 and 514 based on input of a bias signal vb and a voltage at node 505. The gate control signal can control gate terminals of devices 512 and 514 and bias devices 512 and 514 in the subthreshold region. As used and defined herein, when the gate-to-source voltage of a MOS transistor falls below its threshold voltage, the MOS transistor can operate in the subthreshold region. For a MOS transistor operating in the subthreshold region, the drain current Isub can exhibit an exponential dependence on the gate-to-source voltage, as depicted in equation (6), where $\mu$ is carrier mobility, $C_{ox}$ is the oxide capacitance, W/L is the transistor size, $V_T$ is the thermal voltage kT/q, T is the absolute temperature, Vgs is the gate-to-source voltage, Vth is the threshold voltage, and Vds is the drain-to-source voltage.

$$Isub = \mu C_{ox}(W/L)V_T^2 \exp[(Vgs-Vth)/nV_T]^2[1-\exp(-Vds/V_T)] \quad (6)$$

As shown in FIG. 5A, device 512 can include two terminals electrically coupled to nodes 505 and 506. Node 505 can be electrically coupled to current source 510 and amplifier 520. Node 506 can be electrically coupled to device 514. In some embodiments, temperature front-end circuit 220A can generate a temperature voltage—Vptatn proportional to absolute temperature at node 506 with respect to ground supply node 504. Temperature voltage Vptatn can be the difference between the gate-to-source voltages of device 514 and device 512 as depicted in equation (7), where Vgs(514) is the gate-to-source voltage of device 514, and Vgs(512) is the gate-to-source voltage of device 512.

$$Vptatn = Vgs(514) - Vgs(512) \quad (7)$$

Since both device 512 and device 514 are coupled together in series, and there is negligible current into any load circuits connected to node 506, the respective drain currents Isub of devices 512 and device 514 are the same as depicted in equation (6). Solving the gate-to-source voltages (Vgs) for both device 512 and 514 with equation (6), and substituting into equation (7), temperature voltage Vptatn can be calculated as a voltage difference between node 506 and ground supply node 504 and can be reduced to equation (8), where V(506) is the voltage at node 506, Vth(512) is the threshold voltage for device 512, Vth(514) is the threshold voltage for device 514, $u_1W_1/L_1$ is the respective device property of device 514, and $u_2W_2/L_2$ is the respective device property of device 512. In some embodiments, equation (8) assumes that both Vptatn and the difference between bias voltage vb and Vptatn are much greater (e.g., more than about three times) than thermal voltage $V_T$, which is about 25 mV at room temperature.

$$Vptatn = V(506) - 0 = Vth(514) - Vth(512) + nV_T[u_1W_1/L_1)/(u_2W_2/L_2)] \quad (8)$$

As described above, the difference between the threshold voltages of devices 512 and 514 may not change with temperature. According to equation (8), temperature voltage Vptatn can be proportional to thermal voltage $V_T$, which is kT/q and proportional to the absolute temperature T. As a result, temperature voltage Vptatn can be proportional to the absolute temperature T. In some embodiments, as shown in equation (8), temperature voltage Vptatn can be independent of the power supply at input power supply node 501.

Referring to FIG. 5B, similarly to temperature front-end circuit 220A, temperature front-end circuit 220B can generate a temperature voltage—Vptatp proportional to absolute temperature between input power supply node 502 and node 508. Referring to FIG. 5B, temperature front-end circuit 220B can include a current source 530, an amplifier 540, and devices 516 and 518. In some embodiments, current source 530 can be electrically coupled to ground supply node 504 and can be configured to generate a substantially constant bias current through devices 516 and 518. In some embodiments, current source 530 can be implemented as part of a current mirror circuit, or any other suitable circuit configured to generate a substantially constant bias current. In some embodiments, devices 516 and 518 can be implemented as p-type MOS transistors, such as p-type MOSFETs, FinFETs, GAAFETs, and any other suitable devices. In some embodiments, amplifier 540 can generate a gate control signal for devices 516 and 518 based on input of a bias signal vb and a voltage at node 507. The gate control signal can control gate terminals of devices 516 and 518 and bias devices 516 and 518 in the subthreshold region. As shown in FIG. 5B, device 516 can include two terminals electrically coupled to node 508 and input power supply node 502. In some embodiments, input power supply node 502 can be electrically coupled to reference voltage Vref, such as Vref 340 in FIG. 3, Vref 340A in FIG. 4A, and Vref 340B in FIG. 4B. Node 508 can be electrically coupled to device 518.

In some embodiments, similar to the calculation of Vptatn, Vptatp can be calculated as a voltage difference between input power supply node 502 and node 506 and can be depicted in equation (9), where V (508) is the voltage at node 508, Vth (516) is the threshold voltage for device 516, Vth (518) is the threshold voltage for device 518, $u_3 W_3/L_3$ is the respective device property of device 516, and $u_4 W_4/L_4$ is the respective device property of device 518. In some embodiments, equation (9) assumes similar conditions as equation (8).

$$Vptatp = Vref - V(508) = Vth(516) - Vth(518) + nV_T[(u_3 W_3/L_3)/(u_4 W_4/L_4)] \quad (9)$$

In some embodiments, temperature voltage Vptatp can be proportional to the absolute temperature T, similar to temperature voltage Vptatn. In some embodiments, as shown in FIG. 5B, Vptatp is a voltage difference between input power supply node 502 and node 508. As a result, voltage V(508) at node 508 can be dependent on the power supply at input power supply node 502 (e.g., Vref 340 in FIG. 3, Vref 340A in FIG. 4A, and Vref 340B in FIG. 4B).

In some embodiments, as shown in FIG. 5C, temperature front-end circuit 220C can generate a temperature voltage Vptat proportional to absolute temperature using both temperature front-end circuits 220A and 200B. Temperature voltage Vptat can be calculated as a voltage difference between node 506 and node 508, which can be depicted in equation (10).

$$Vptat = V(506) - V(508) = Vth(514) - Vth(512) + Vth(516) - Vth(518) + nV_T[u_1 W_1/L_1)/(u_2 W_2/L_2)] + nV_T[(u_3 W_3/L_3)/(u_4 W_4/L_4)] - Vref \quad (10)$$

In some embodiments, similar to temperature voltages Vptatn and Vptatp, temperature voltage Vptat can be proportional to the absolute temperature T. With the implementation of both n-type and p-type MOS transistors (also referred to as "CMOS transistors"), the slope of Vptat with respect to temperature T can increase by adding the slope of Vptatn and the slope of Vptatp, as shown in equation (10). In some embodiments, the increase of Vptat slope can improve the temperature sensitivity of temperature front-end circuit 220C without the exponential area increase in the bipolar-based temperature sensors.

Figure 6:
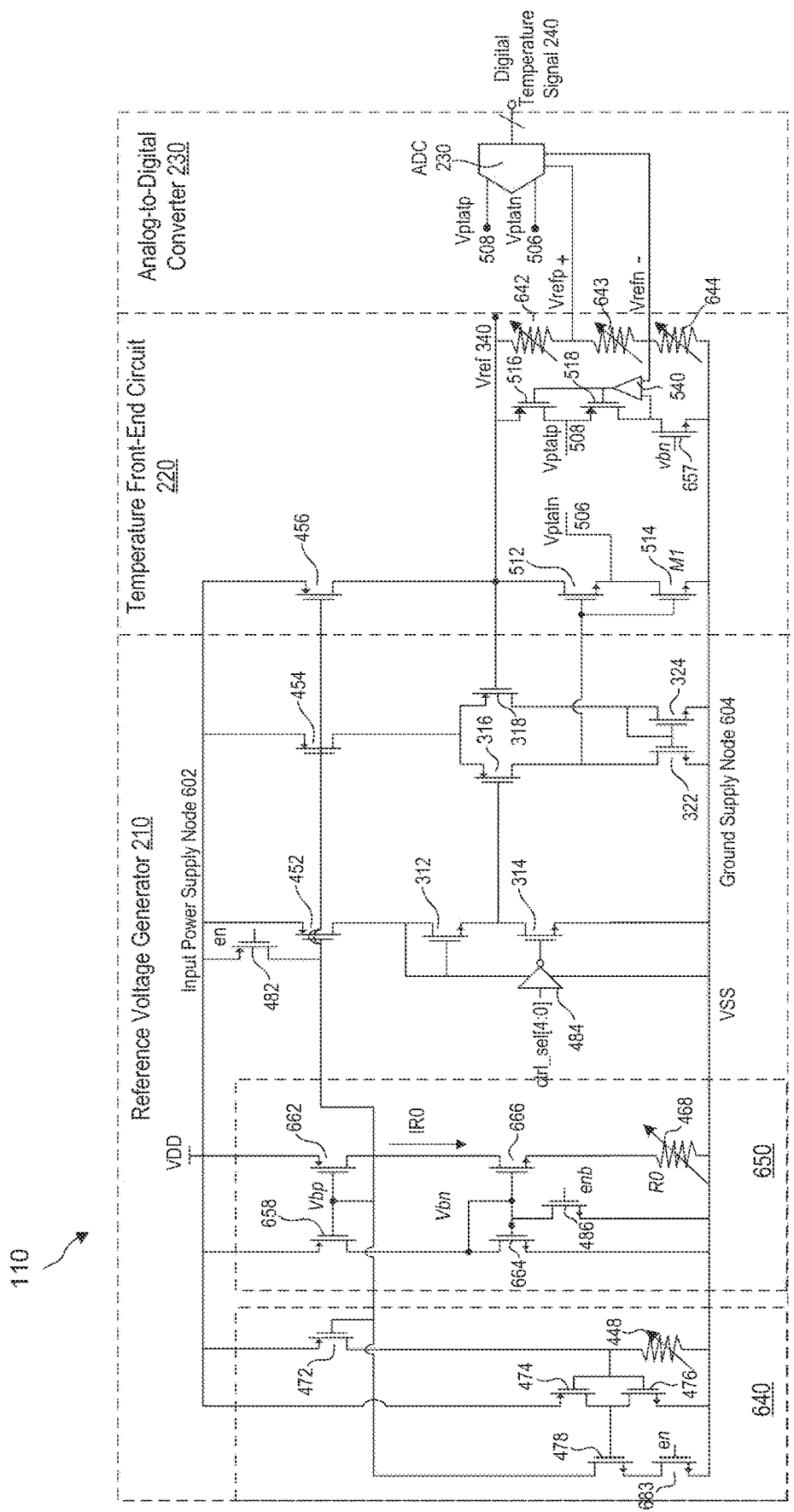
FIG. 6 illustrates a CMOS-based temperature sensor, according to some embodiments.

FIG. 6 illustrates an embodiment of CMOS-based temperature sensor 110, according to some embodiments. Elements in FIG. 6 with the same annotations as elements in FIGS. 3, 4A-4B, and 5A-5C are described above. In some embodiments, CMOS-based temperature sensor 110 can be electrically coupled to input power supply node 602 and ground supply node 604. In some embodiments, input power supply node 602 can be electrically connected to a low voltage digital power supply (e.g., VDD at about 0.5 V to about 0.9 V). Ground supply node 304 can be electrically connected to a ground level (e.g., VSS at 0 V).

In some embodiments, CMOS-based temperature sensor 110 can integrate the CMOS-based reference voltage generator and CMOS-based temperature front-end circuit described in FIGS. 3, 4A-4B, and 5A-5C into a single design. As shown in FIG. 6, CMOS-based temperature sensor 110 can include CMOS-based reference voltage generator 210, CMOS-based temperature front-end circuit 220, and ADC 230. In some embodiments, CMOS-based temperature sensor 110 can further include devices 658, 662, 664, 666, 657, and 683 and resistors 642, 643, and 644. In some embodiments, devices 664, 666, 657, and 683 can be implemented as n-type MOS transistors, such as n-type MOSFETs, FinFETs, GAAFETs, and any other suitable devices. In some embodiments, devices 658 and 662 can be implemented as p-type MOS transistors, such as p-type MOSFETs, FinFETs, GAAFETs, and any other suitable devices.

In some embodiments, resistor 448 and devices 472, 474, 476, 478, and 683 can form a start-up circuit 640 corresponding to start-up circuit 440 as shown in FIGS. 4A and 4B. In some embodiments, device 683 can be controlled by an enable signal (referred to as "en") during start-up of the circuit. Device 683 can be configured to, in response to an activation of the enable signal, couple device 478 to ground supply node 604, allowing a start-up current to flow through device 478.

In some embodiments, devices 658, 662, 664, and 666 and resistor 468 can form a supply independent biasing circuit 650 corresponding to supply independent biasing circuit 450 as shown in FIGS. 4A and 4B. In some embodiments, supply independent biasing circuit 650 can generate a substantially constant bias current IR0 through device 666 and resistor 468. In some embodiments, the substantially constant bias current IR0 can be independent of the power supply at input power supply node 602, as described above in FIGS. 4A and 4B. In some embodiments, the substantially constant bias current IR0 can be tuned by adjusting the resistance of resistor 468. In some embodiments, supply independent biasing circuit 650 can have a bias voltage Vbp at gate terminals of devices 658 and 662 and a bias voltage Vbn at gate terminals of devices 664 and 666. In some embodiments, supply independent biasing circuit 650 can provide bias voltage Vbp for devices 352, 354, and 356. Devices 352, 354, and 356 can have gate terminals electrically connected to bias voltage Vbp to form current mirror circuits and generate the substantially same constant bias current IR0 flowing through each device.

In some embodiments, reference voltage generator 210 can generate reference voltage Vref 340 for temperature front-end circuit 220 and ADC 230. As described above, reference voltage Vref 340 can be a sum of threshold voltage difference between devices 312 and 314 and threshold voltage difference between devices 316 and 318 as shown in FIG. 6. In some embodiments, reference voltage Vref 340 can be independent of the supply voltage at input power supply node 602. Though FIG. 6 illustrates two reference voltage circuits coupled together, similar to FIGS. 4A and 4B, to generate reference voltage Vref 340, one or more reference voltage circuits can be cascaded together to generate reference voltage Vref 340. In some embodiments, reference voltage Vref 340 can be divided by resistors 642, 643, and 644 to generate a pair of differential reference voltages Vrefp and Vrefn for ADC 230. In some embodiments, resistances of resistors 642, 643, and 644 can be adjusted to tune reference voltages Vrefp and Vrefn. Though FIG. 6 illustrates that both differential reference voltages Vrefp and Vrefn are electrically coupled to ADC 230, ADC 230 can be electrically coupled to a single reference voltage of Vrefn, Vrefp, or Vref.

In some embodiments, temperature front-end circuit 220 can generate temperature voltage Vptatn, which is proportional to absolute temperature, at node 506 with respect to ground supply node 604. Device 512 can have a first terminal electrically coupled to reference voltage Vref 340 and a second terminal electrically coupled to device 514 at node 506. The second terminal at node 506 can provide temperature voltage Vptatn proportional to absolute temperature. In some embodiments, temperature front-end circuit 220 can generate temperature voltage Vptatp, which is proportional to absolute temperature, between node 508 and reference voltage Vref 340. Device 516 can have a first terminal electrically coupled to reference voltage Vref 340 and a second terminal electrically coupled to device 518 at node 508. The second terminal at node 508 can provide temperature voltage Vptatp proportional to absolute temperature. In some embodiments, gate terminal of device 657 can be electrically coupled to bias voltage Vbn to form a current mirror circuit and generate the substantially same constant bias current IR0 flowing through device 657. Though CMOS-based temperature front-end circuit 220 in FIG. 6 generates both temperature voltages Vptatn and Vptatp proportional to absolute temperature for ADC 230, CMOS-based temperature front-end circuit 220 can generate a single temperature voltage Vptatn or temperature voltage Vptatp for ADC 230.

Referring to FIG. 6, ADC 230 can be electrically coupled to differential reference voltages Vrefn and Vrefp and convert temperature voltages Vptatn and Vptatp into digital temperature signal 240. In some embodiments, ADC 230 can provide high precision and high accuracy with a sigma-delta architecture and over sampling. With the sigma-delta architecture, ADC 230 can work with a wider range of temperature voltage Vptat. As a result, drain-to-source voltages of devices 514 and 516 can be greater than about $5\,V_T$ to minimize channel length modulation effects in these devices. Though FIG. 6 illustrates ADC 230 is electrically coupled to differential reference voltages Vrefn and Vrefp and differential temperature voltages Vptatn and Vptatp, ADC 230 can be electrically coupled to a single reference voltage (e.g., Vref) and a single temperature voltage (e.g., Vptatn or Vptatp). In some embodiments, after converting temperature voltages Vptatn and Vptatp based on reference voltages Vref or Vrefn and Vrefp, digital temperature signal 240 can be independent of reference voltages Vref, Vrefn, and Vrefp.

In some embodiments, as shown in FIG. 6, as both reference voltage generator 210 and temperature front-end circuit 220 can be implemented with CMOS transistors, CMOS-based temperature sensor 110 can have a compact design. In some embodiments, with supply independent biasing circuit 450, the PSRR of reference voltage Vref 340 can be improved by about an order of magnitude and reference voltage Vref 340 can be further independent of the supply voltage. With supply independent reference voltage Vref 340 and the substantially constant bias current IR0 provided by reference voltage generator 210, temperature front-end circuit 220 can operate under a low voltage digital power supply (e.g., about 0.5 V to about 0.9 V) at input power supply node 602 and generate a temperature voltage Vptat proportional to absolute temperature. In some embodiments, as shown in FIG. 6, temperature front-end circuit 220 can be implemented with CMOS transistors (e.g., both n-type and p-type MOS transistors) to improve its temperature sensitivity.

Figure 7:
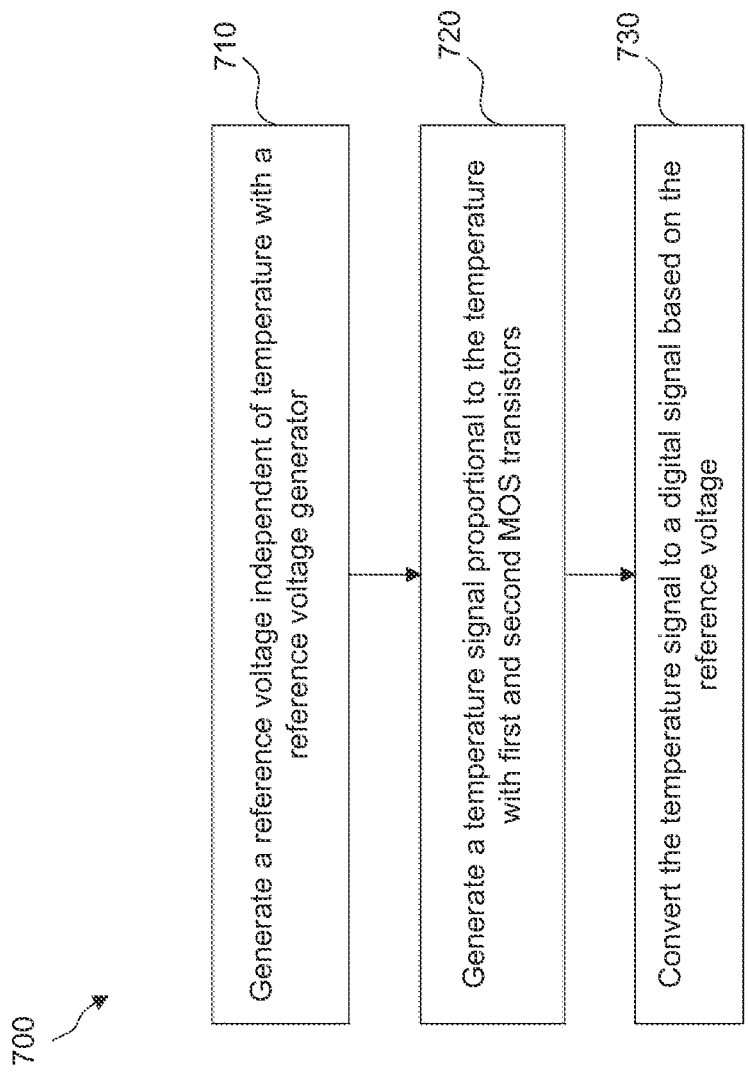
FIG. 7 illustrates a method for operating a CMOS-based temperature sensor, according to some embodiments.

FIG. 7 illustrates a method 700 for operating a CMOS-based temperature sensor, according to some embodiments. For illustrative purposes, the operations illustrated in method 700 will be described with reference to the example CMOS-based temperature sensor 110 in FIG. 6. Additional operations may be performed between various operations of method 700 and may be omitted merely for clarity and ease of description. Additional operations can be provided before, during, and/or after method 700; one or more of these additional operations are briefly described herein. Moreover, not all operations may be needed to perform the disclosure provided herein. Additionally, some of the operations may be performed simultaneously or in a different order than shown in FIG. 7. In some embodiments, one or more other operations may be performed in addition to or in place of the presently described operations.

Referring to FIG. 7, method 700 begins with operation 710 to generate a reference voltage with a reference voltage generator. The reference voltage is independent of temperature. For example, as shown in FIG. 6, reference voltage generator 210 can generate reference voltage Vref 340. In some embodiments, reference voltage generator 210 can be CMOS-based and include both n-type and p-type MOS transistors. In some embodiments, reference voltage Vref 340 can be a sum of the threshold voltage difference between devices 312 and 314 and the threshold voltage difference between devices 516 and 518. As described above, reference voltage Vref 340 can be independent of temperature and the power supply at input power supply node 602.

Referring to FIG. 7, in operation 720, a temperature signal proportional to temperature is generated with first and second MOS transistors. For example, as shown in FIG. 6, temperature voltage Vptatn can be generated with devices 512 and 514. In some embodiments, devices 512 and 514 can be implemented as n-type MOS transistors. Device 512 can have a first terminal electrically coupled to reference voltage Vref 340 and a second terminal electrically coupled to device 514 at node 506. The second terminal at node 506 can provide temperature voltage Vptatn proportional to absolute temperature. In some embodiments, temperature voltage Vptatp can be generated with devices 516 and 518. In some embodiments, devices 516 and 518 can be implemented as p-type MOS transistors. Device 516 can have a first terminal electrically coupled to reference voltage Vref 340 and a second terminal electrically coupled to device 518 at node 508. The second terminal at node 508 can provide temperature voltage Vptatp proportional to absolute temperature. In some embodiments, temperature voltage Vptat can be generated with devices 512, 514, 516, and 518 and temperature voltage Vptat can be a sum of temperature voltages Vptatn and Vptatp. Temperature voltage Vptat can provide an increased temperature slope and thus temperature sensitivity without increasing circuit area.

Referring to FIG. 7, in operation 730, the temperature signal is converted to a digital signal based on the reference voltage. For example, as shown in FIG. 6, ADC 230 can convert temperature voltages Vptatn and Vptatp to digital temperature signal 240 based on differential reference voltages Vrefp and Vrefn. In some embodiments, ADC 230 can have a sigma-delta architecture and over sampling to provide higher precision and higher accuracy than other ADC designs. In some embodiments, ADC 230 can convert a single temperature voltage Vptatn or Vptatp to digital temperature signal 240 based on a single reference voltage Vref, Vrefn, or Vrefp.

Embodiments of the present disclosure provide a compact low voltage CMOS-based temperature sensor 110. CMOS-based temperature sensor 110 includes CMOS-based reference voltage generator 210, CMOS-based temperature front-end circuit 220, and high precision ADC 230. CMOS-based reference voltage generator 210 can use a low voltage digital power supply (e.g., about 0.5 V to about 0.9 V) to generate reference voltage Vref 340 independent of temperature and the digital power supply. In some embodiments, reference voltage Vref 340 can be generated based on threshold voltage differences of two or more MOS transistors. CMOS-based temperature front-end circuit 220 can include devices 512 and 514 to generate temperature voltage Vptatn and devices 516 and 518 to generate temperature voltage Vptatp. In some embodiments, the differential temperature voltages Vptatn and Vptatp can increase temperature sensitivity of CMOS-based temperature front-end circuit 220. ADC 230 can be electrically coupled to reference voltage Vref 340 and convert temperature voltages Vptatn and Vptatp to a digital temperature signal 240. Implemented with both n-type and p-type MOS transistors, CMOS-based reference voltage generator 210 and CMOS-based temperature front-end circuit 220 can be integrated into a single design having a smaller area and higher temperature sensitivity than bipolar-based temperature sensors. Additionally, CMOS-based temperature sensor 110 can save power by about 1% to about 10% compared to other temperature sensor designs.

Figure 8:
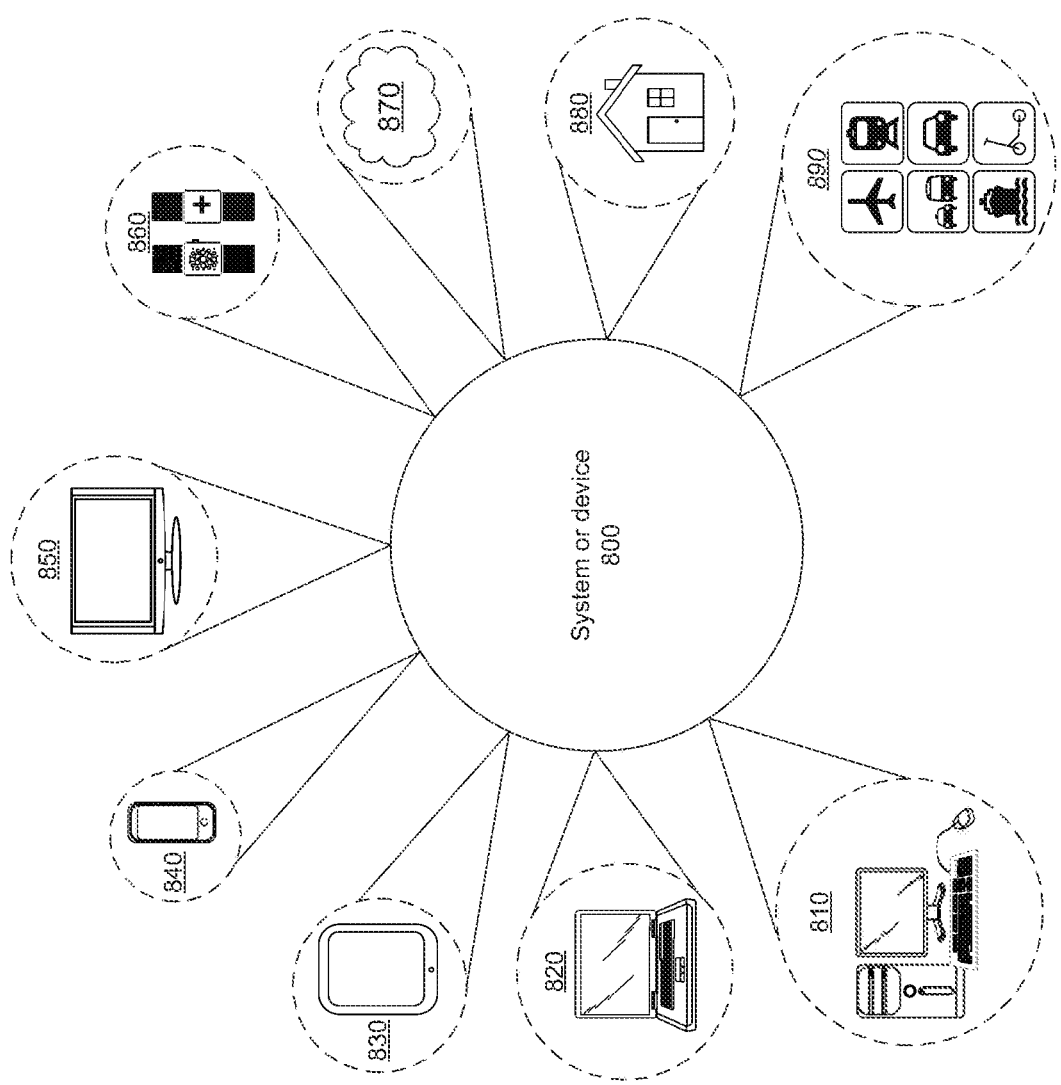
FIG. 8 illustrates various exemplary systems or devices that include embodiments of the disclosed CMOS-based temperature sensor.

FIG. 8 illustrates exemplary systems of devices that include embodiments of the CMOS-based temperature sensor as described herein. System or device 800, which can incorporate or otherwise utilize one or more of the techniques described herein, can be utilized in a wide range of areas. For example, system or device 800 can be utilized as part of the hardware of systems such as a desktop computer 810, a laptop computer 820, a tablet computer 830, a cellular or mobile phone 840, or a television 850 (or a set-top box coupled to a television).

Similarly, the disclosed embodiments can be utilized in a wearable device 860, such as a smartwatch or a health-monitoring device. Smartwatches can implement a variety of different functions—for example, access to email, cellular service, calendar, health monitoring, etc. A wearable device can also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 can also be used in various other contexts. For example, system or device 800 can be utilized in the context of a server computer system, such as a dedicated server or on shared hardware that implements a cloud-based service 870. Still further, system or device 800 can be implemented in a wide range of specialized devices, such as home electronic devices 880 that includes refrigerators, thermostats, security cameras, etc. The interconnection of such devices is often referred to as the "Internet of Things" (IoT). Elements can also be implemented in various modes of transportation. For example, system or device 800 can be employed in the control systems, guidance systems, entertainment systems, etc. of various types of vehicles 890.

The applications illustrated in FIG. 8 are merely exemplary and are not intended to limit the potential future applications of disclosed systems or devices. Other example applications include, without limitation, portable gaming devices, music players, data storage devices, unmanned aerial vehicles, etc.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a reference voltage generator configured to generate a reference voltage;
    a temperature circuit comprising a first transistor and a second transistor, wherein the temperature circuit is configured to generate a temperature signal proportional to temperature, wherein:
        the first transistor comprises first and second terminals;
        the first terminal is directly connected to the reference voltage;
        the second terminal is directly connected to the second transistor; and
        the second terminal provides the temperature signal; and
    an analog-to-digital converter (ADC) electrically coupled to the reference voltage and configured to generate a digital signal based on the temperature signal.

2. The circuit of claim 1, wherein the reference voltage generator comprises a third transistor with a first threshold voltage and a fourth transistor with a second threshold voltage, and wherein the reference voltage is independent of temperature and generated based on a difference between the first threshold voltage and the second threshold voltage.

3. The circuit of claim 1, wherein at least one of the first and second transistors are n-type MOS transistors, and wherein the temperature signal and the digital signal are independent of the reference voltage.

4. The circuit of claim 1, wherein at least one of the first and second transistors are p-type MOS transistors, and wherein the temperature signal is dependent on the reference voltage and the digital signal is independent of the reference voltage.

5. The circuit of claim 1, further comprising third and fourth transistors configured to generate an additional temperature signal proportional to temperature, wherein:
the third transistor comprises third and fourth terminals;
the third terminal is electrically coupled to the reference voltage;
the fourth terminal is electrically coupled to the fourth transistor;
the fourth terminal provides the additional temperature signal; and
the digital signal is generated based on a pair of differential inputs of the temperature signal and the additional temperature signal.

6. The circuit of claim 1, wherein the reference voltage generator further comprises a supply independent biasing circuit configured to generate a bias current for the reference voltage generator independent of an input power supply.

7. The circuit of claim 6, wherein the reference voltage generator further comprises a regulated current source coupled to the reference voltage.

8. The circuit of claim 1, further comprising a plurality of resistors configured to generate a pair of differential reference voltages for the ADC based on the reference voltage.

9. A circuit, comprising:
a reference voltage generator comprising first and second metal-oxide-semiconductor (MOS) transistors configured to generate a reference voltage;
a temperature circuit configured to generate a temperature signal proportional to temperature and comprising third and fourth MOS transistors, wherein:
a first terminal of the third MOS transistor is electrically connected to the reference voltage, and
a second terminal of the third MOS transistor is electrically connected to the fourth MOS transistor;
the second terminal provides the temperature signal; and
an analog-to-digital converter (ADC) electrically coupled to the reference voltage and configured to generate a digital signal based on the temperature signal.

10. The circuit of claim 9, wherein at least one of the third and fourth MOS transistors are n-type MOS transistors.

11. The circuit of claim 9, wherein the temperature circuit is further configured to generate the temperature signal independent of the reference voltage, and wherein the ADC is further configured to generate the digital signal independent of the reference voltage.

12. The circuit of claim 9, wherein the first MOS transistor has a first threshold voltage and the second MOS transistor has a second threshold voltage, and wherein the reference voltage generator is configured to generate the reference voltage based on a difference between the first threshold voltage and the second threshold voltage.

13. The circuit of claim 9, wherein at least one of the third and fourth MOS transistors are p-type MOS transistors, and wherein the temperature circuit is further configured to generate the temperature signal based on the reference voltage, and wherein the ADC is further configured to generate the digital signal independent of the reference voltage.

14. The circuit of claim 9, wherein the reference voltage generator further comprises:
a supply independent biasing circuit configured to generate a bias current for the reference voltage generator, wherein the bias current is independent of an input power supply; and
a start-up circuit configured to provide a start-up current for the supply independent biasing circuit.

15. The circuit of claim 9, wherein the ADC is further configured to receive the temperature signal, and wherein the temperature signal is based on a difference between a threshold voltage of the third MOS transistor and a threshold voltage of the fourth MOS transistor.

16. A circuit, comprising:
a reference voltage generator comprising first and second metal-oxide-semiconductor (MOS) transistors, wherein the second MOS transistor comprises a gate terminal configured to provide a reference voltage;
a temperature circuit configured to generate a temperature signal proportional to temperature and comprising third and fourth MOS transistors, wherein:
a first terminal of the third MOS transistor is electrically connected to the gate terminal of the second MOS transistor, and
a second terminal of the third MOS transistor is electrically connected to the fourth MOS transistor;
the second terminal provides the temperature signal; and
an analog-to-digital converter (ADC) electrically coupled to the reference voltage and configured to generate a digital signal based on the temperature signal.

17. The circuit of claim 16, further comprising a fifth MOS transistor and a sixth MOS transistor, wherein the reference voltage generator is further configured to generate the reference voltage based on a threshold voltage difference between the first and second MOS transistors and a threshold voltage difference between the fifth and sixth MOS transistors.

18. The circuit of claim 16, wherein the ADC is further configured to receive the temperature signal, and wherein the temperature circuit is further configured to generate the temperature signal based on a threshold voltage difference between the third and fourth MOS transistors.

19. The circuit of claim 16, further comprising fifth and sixth MOS transistors configured to generate an additional temperature signal, wherein:
a third terminal of the fifth MOS transistor is electrically coupled to the gate terminal of the second MOS transistor;
a fourth terminal of the sixth MOS transistor is electrically coupled to the fourth MOS transistor;
the fourth terminal provides the additional temperature signal; and
the digital signal is generated based on a pair of differential inputs of the temperature signal and the additional temperature signal.

20. The circuit of claim 16, wherein the reference voltage generator is further configured to generate the reference voltage independent of temperature, and wherein the ADC is further configured to generate the digital signal proportional to temperature.

* * * * *